United States Patent
Schlicht et al.

(10) Patent No.: US 7,011,935 B2
(45) Date of Patent: Mar. 14, 2006

(54) METHOD FOR THE REMOVAL OF AN IMAGING LAYER FROM A SEMICONDUCTOR SUBSTRATE STACK

(75) Inventors: Karin Schlicht, Cumberland, RI (US); John Biafore, Glocester, RI (US); Mario Reybrouck, Zele (BE)

(73) Assignee: Arch Specialty Chemicals, Inc., Norwalk, CT (US)

( * ) Notice: Subject to any disclaimer, the term of this patent is extended or adjusted under 35 U.S.C. 154(b) by 0 days.

(21) Appl. No.: 10/665,412

(22) Filed: Sep. 18, 2003

(65) Prior Publication Data

US 2004/0116312 A1    Jun. 17, 2004

Related U.S. Application Data

(60) Provisional application No. 60/411,985, filed on Sep. 19, 2002.

(51) Int. Cl.
*G03F 7/26*    (2006.01)

(52) U.S. Cl. .................. 430/329; 430/322; 134/1
(58) Field of Classification Search ............. 430/329, 430/322; 438/689, 694; 134/1, 1.3, 26
See application file for complete search history.

(56) References Cited

U.S. PATENT DOCUMENTS 5,964,951 A * 10/1999 Yamamoto et al. .......... 134/1.2
6,159,646 A * 12/2000 Jeon et al. .................... 430/30
6,200,724 B1 * 3/2001 Namiki et al. .......... 430/270.1
2004/0076910 A1 * 4/2004 Rutter et al. ................ 430/311

* cited by examiner

*Primary Examiner*—Kathleen Duda
(74) *Attorney, Agent, or Firm*—Ohlandt, Greeley, Ruggiero & Perle, LLP

(57) ABSTRACT

Processes to overcome mistakes, such as, incorrect film thicknesses, poor coating quality, and incorrect feature dimensions made during the lithographic process in multi-layer imaging systems are provided. To optimize manufacturing efficiency, it is desirable to be able to remove the top layer (an imaging layer) without having to remove, recoat, and usually cure the bottom layer (undercoat or underlayer). A rework process for removing an imaging layer from a substrate stack is such a process. The stack comprises a substrate, an underlayer adjacent to the substrate, and an imaging layer comprising silicon adjacent to the underlayer. The process comprises the steps of:

(a) contacting the substrate stack with an imaging layer removal solvent;
(b) removing the imaging layer with the imaging layer removal solvent thereby forming a substrate/underlayer stack, wherein the imaging layer removal solvent is selected from the group consisting of: glycol ethers, ketones, esters, lactates, dimethylsulfoxide (DMSO), dimethylformamide (DMF), tetrahydrofuran (THF), methyl tetrahydrofuran, dioxane, tetrahydropyran, ethyl tetrahydropyran-4-acetate, methyl tetrahydropyran-4-methanol, tetrahydropyran-4-one, n-butyl acetate, n-amyl acetate, and any combinations thereof; and
(c) removing the imaging layer removal solvent from the substrate/underlayer stack after the imaging layer is removed.

68 Claims, 1 Drawing Sheet

METHOD FOR THE REMOVAL OF AN IMAGING LAYER FROM A SEMICONDUCTOR SUBSTRATE STACK

RELATED APPLICATION

This application claims priority to U.S. Provisional Patent Application No. 60/411,985 filed on Sep. 19, 2002, pending.

BACKGROUND TO THE INVENTION

1. Field of the Invention

The present invention relates to deep UV lithography used in semiconductor manufacturing and more particularly to rework of multilayer photoresist systems.

2. Description of Related Art

The continuing drive for miniaturization of semiconductor devices has caused an increased rigor in the photolithography used to delineate the fine patterns of those devices. The demands for finer resolution have caused the shrinkage of imaging wavelengths from 365 nm (high pressure mercury lamp) to 248 nm (KrF excimer lasers), to 193 nm (ArF excimer lasers) and beyond. Because of this, the traditional lithographic materials, such as novolaks, diazonaphthoquinones, etc., are unsuitable platforms for ultra large scale integration (ULSI) manufacture and beyond. Thus, in order to utilize deep UV light wavelengths, new resist materials with low optical absorption and enhanced sensitivities were needed. As the patterns and wavelengths become finer, the materials properties of the photoresists used for pattern delineation have become more and more demanding. In particular, requirements of sensitivity, transparency, aesthetics of the image produced, and the selectivity of the resists to etch conditions for pattern transfer become more and more strenuous.

Chemically amplified resist materials have been developed through the use of acid-labile polymers in order to meet the above-mentioned criteria. They have shown great promise in increasing resolution. However, chemically amplified resist systems have many shortcomings. One problem is standing wave effects, which occur when monochromatic light is reflected off the surface of a reflective substrate during exposure. The formation of standing waves in the resist reduces resolution and causes line width variations. For example, standing waves in a positive resist have a tendency to result in a foot at the resist/substrate interface reducing the resolution of the resist. Frequently, resists are employed over a thin antireflective coating to minimize such problems.

In addition, chemically amplified resist profiles and resolution may change due to substrate poisoning. Particularly, this effect occurs when the substrate has a nitride layer. It is believed that residual N—H bonds in the nitride film deactivate the acid at the nitride/resist interface. For a positive resist, this results in an insoluble area, and either resist scumming, or a foot at the resist/substrate interface.

Furthermore, lithographic aspect ratios require the chemically amplified resist layer be thin, e.g., about 0.5 $\mu$m or lower, to print sub 0.18 $\mu$m features. This in turn requires the resist to have excellent plasma etch resistance such that resist image features can be transferred down into the underlying substrate.

One approach to solving the need for high resolution and high etch resistant resists involves the use of multilayer resist systems. In this approach, a thin, silicon-containing imaging layer is deposited over a thicker planarizing layer (underlayer). The underlayer absorbs most of the deep UV light attenuating standing wave effects. In addition, the underlayer prevents deactivation of the acid catalyst at the resist/substrate interface. Furthermore, the underlayer can contain some aromatic groups to provide etch resistance.

In the typical bilayer resist process, the undercoat layer is applied on the substrate. The chemically amplified resist is then applied on the undercoat layer, exposed to deep UV light and developed to form images in the chemically amplified resist topcoat. The bilayer resist system is then placed in an oxygen plasma etch environment to etch the undercoat in the areas where the chemically amplified resist has been removed by the development. In a subsequent step, the exposed substrate is plasma etched. The oxidized resist and the undercoat provide plasma etch resistance to the substrate etch.

Examples of bilayer imaging systems have been disclosed in commonly assigned U.S. Pat. Nos. 6,146,793; 6,165,682; and U.S. patent application Ser. No. 09/576,146, which are incorporated by reference herein.

During the manufacture of semiconductor devices it may become necessary to redo photoresist imaging steps because of mistakes or equipment problems. The photoresist imaging layer must be removed and the surface of the underlayer must be reprepared, recoated with photoresist and reimaged. The present invention overcomes the need to reprocess the underlayer, resulting in a more efficient overall manufacturing process.

SUMMARY OF THE INVENTION

This invention provides processes to enable lithographers to overcome the mistakes made during the process of lithography. A first embodiment provides a rework process for removing an imaging layer from a substrate stack, the stack comprising a substrate, an underlayer adjacent to the substrate, and an imaging layer comprising silicon adjacent to the underlayer, the process comprising the steps of:

(a) contacting the substrate stack with an imaging layer removal solvent;

(b) removing the imaging layer with the imaging layer removal solvent thereby forming a substrate/underlayer stack, wherein the imaging layer removal solvent is selected from the group consisting of: glycol ethers, ketones, esters, lactates, dimethylsulfoxide (DMSO), dimethylformamide (DMF), tetrahydrofuran (THF), methyl tetrahydrofuran, dioxane, tetrahydropyran, ethyl tetrahydropyran-4-acetate, methyl tetrahydropyran-4-methanol, tetrahydropyran-4-one, n-butyl acetate, n-amyl acetate, and any combinations thereof; and (c) removing the imaging layer removal solvent from the substrate/underlayer stack after the imaging layer is removed.

A lithographic imaging rework process is also provided for correcting one or more defects on an imaging layer on a substrate stack, the substrate stack comprising a substrate, an underlayer adjacent to the substrate, and an imaging layer comprising silicon adjacent to the underlayer, the process comprising the steps of:

(a) contacting the substrate stack with an imaging layer removal solvent selected from the group consisting of: glycol ethers, ketones, esters, lactates, dimethylsulfoxide (DMSO), dimethylformamide (DMF), tetrahydrofuran (THF), methyl tetrahydrofuran, dioxane, tetrahydropyran, ethyl tetrahydropyran-4-acetate, methyl tetrahydropyran-4-methanol, tetrahydropyran-4-one, n-butyl acetate, n-amyl acetate, and any combinations thereof;
(b) removing the imaging layer with the imaging layer removal solvent, thereby forming a substrate/underlayer stack;
(c) removing the imaging layer removal solvent from the substrate/underlayer stack after the imaging layer is removed;
(d) coating the substrate/underlayer stack with a new imaging layer;
(e) exposing the new imaging layer to radiation; and
(f) developing the new imaging layer.

The present invention also provides another rework process for removing an imaging layer from a substrate stack, the stack comprising a substrate, an underlayer adjacent to the substrate, and an imaging layer comprising silicon adjacent to the underlayer, the process comprising the steps of:
(a) contacting the substrate stack with an imaging layer removal solvent;
(b) removing the imaging layer with the imaging layer removal solvent thereby forming a substrate/underlayer stack, wherein the imaging layer removal solvent is selected from the group consisting of: glycol ethers, ketones, esters, lactates, dimethylsulfoxide (DMSO), dimethylformamide (DMF), tetrahydrofuran (THF), methyl tetrahydrofuran, dioxane, tetrahydropyran, ethyl tetrahydropyran-4-acetate, methyl tetrahydropyran-4-methanol, tetrahydropyran-4-one, n-butyl acetate, n-amyl acetate, and any combinations thereof;
(c) rinsing the imaging layer removal solvent from the substrate/underlayer stack with a rinse solution after the imaging layer is removed; and
(d) baking the substrate/underlayer stack to remove the rinse solution.

DETAILED DESCRIPTION OF THE INVENTION

Figure 1:
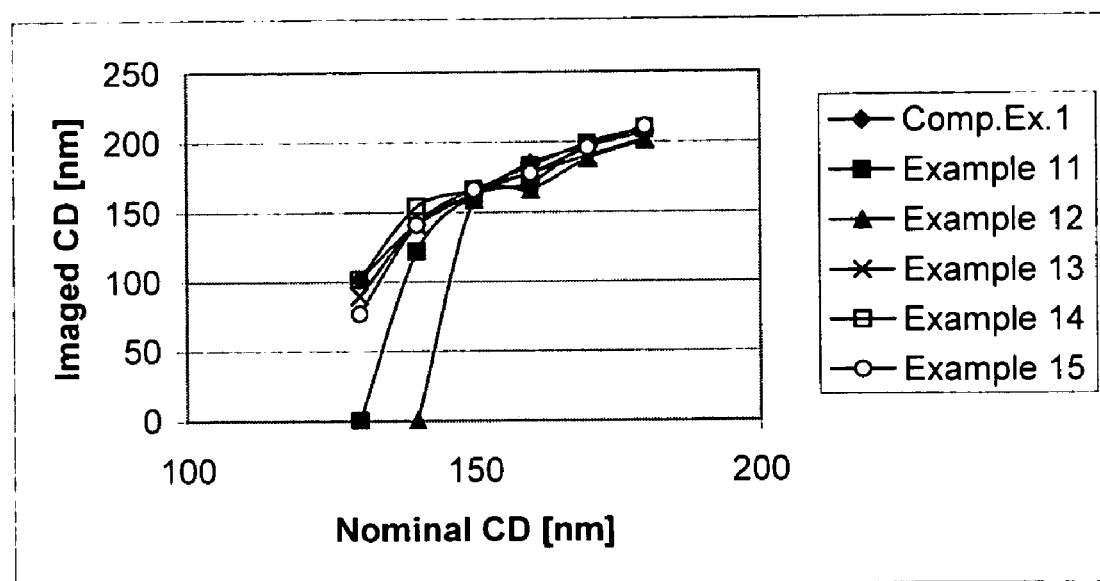
FIG. 1 is a graphical representation of the imaged critical dimension (CD) versus the nominal CD on a substrate processed according to the present invention.

The present invention provides processes to overcome mistakes made during the lithographic process in multilayer imaging systems. Examples of mistakes that might require reprocessing again include, but are not limited to, incorrect film thicknesses, poor coating quality, and incorrect feature dimensions. To optimize manufacturing efficiency, it is desirable to be able to remove the top layer (an imaging layer) without having to remove, recoat, and usually cure the bottom layer (undercoat or underlayer).

A first embodiment provides a rework process for removing an imaging layer from a substrate stack, the stack comprising a substrate, an underlayer adjacent to the substrate, and an imaging layer comprising silicon adjacent to the underlayer, the process comprising the steps of:
(a) contacting the substrate stack with an imaging layer removal solvent;
(b) removing the imaging layer with the imaging layer removal solvent thereby forming a substrate/underlayer stack, wherein the imaging layer removal solvent is selected from the group consisting of: glycol ethers, ketones, esters, lactates, dimethylsulfoxide (DMSO), dimethylformamide (DMF), tetrahydrofuran (THF), methyl tetrahydrofuran, dioxane, tetrahydropyran, ethyl tetrahydropyran-4-acetate, methyl tetrahydropyran-4-methanol, tetrahydropyran-4-one, n-butyl acetate, n-amyl acetate, and any combinations thereof; and
(c) removing the imaging layer removal solvent from the substrate/underlayer stack after the imaging layer is removed.

A second embodiment of the present invention provides a lithographic imaging rework process for correcting one or more defects on an imaging layer on a substrate stack, the substrate stack comprising a substrate, an underlayer adjacent to the substrate, and an imaging layer comprising silicon adjacent to the underlayer, the process comprising the steps of:
(a) contacting the substrate stack with an imaging layer removal solvent selected from the group consisting of: glycol ethers, ketones, esters, lactates, dimethylsulfoxide (DMSO), dimethylformamide (DMF), tetrahydrofuran (THF), methyl tetrahydrofuran, dioxane, tetrahydropyran, ethyl tetrahydropyran-4-acetate, methyl tetrahydropyran-4-methanol, tetrahydropyran-4-one, n-butyl acetate, n-amyl acetate, and any combinations thereof;
(b) removing the imaging layer with the imaging layer removal solvent, thereby forming a substrate/underlayer stack;
(c) removing the imaging layer removal solvent from the substrate/underlayer stack after the imaging layer is removed;
(d) coating the substrate/underlayer stack with a new imaging layer;
(e) exposing the new imaging layer to radiation; and
(f) developing the new imaging layer.

A third embodiment of the present invention provides a rework process for removing an imaging layer from a substrate stack, the stack comprising a substrate, an underlayer adjacent to the substrate, and an imaging layer comprising silicon adjacent to the underlayer, the process comprising the steps of:
(a) contacting the substrate stack with an imaging layer removal solvent;
(b) removing the imaging layer with the imaging layer removal solvent thereby forming a substrate/underlayer stack, wherein the imaging layer removal solvent is selected from the group consisting of: glycol ethers, ketones, esters, lactates, dimethylsulfoxide (DMSO), dimethylformamide (DMF), tetrahydrofuran (THF), methyl tetrahydrofuran, dioxane, tetrahydropyran, ethyl tetrahydropyran-4-acetate, methyl tetrahydropyran-4-methanol, tetrahydropyran-4-one, n-butyl acetate, n-amyl acetate, and any combinations thereof;
(c) rinsing the imaging layer removal solvent from the substrate/underlayer stack with a rinse solution after the imaging layer is removed; and
(d) baking the substrate/underlayer stack to remove the rinse solution.

The substrates useful in this invention include, but are not limited to, those used in semiconductor manufacture. Such substrates include wafers, which may comprise silicon, various nitrides, oxides, oxynitrides, or other inorganic derivatives of silicon or coatings of the nitrides, oxides, oxynitrides, other inorganic derivatives of silicon, metals, low k dielectric coatings, and the like. Examples of suitable metals include, but are not limited to, copper, aluminum, or tungsten. Examples of suitable low K dielectric coatings include organic materials, such as SiLK (Dow Chemical), carbon-doped oxide, carbon-doped silicon based materials, such as, Coral (Nevellus) and Black Diamond (Applied Materials). Various semiconductor structures may also have been produced on the substrate, such as, for example, metal lines.

Imaging layers (also called resists or photoresists) useful in this invention are those photosensitive compositions whose components, typically the polymers, comprise silicon. In a preferred embodiment, the resists are chemically amplified resists. Examples of suitable chemically amplified resists include an alkali solubilizing group blocked by an acid sensitive group. Examples of suitable alkali solubilizing groups include, but are not limited to, carboxylic acids, phenols, hydroxyimides, hydroxymethylimides, fluorinated alcohols and silanols. Examples of suitable blocking groups include, but are not limited to, alkyl groups containing tertiary carbons, and alpha alkoxy alkyls, and arylisopropyl groups. Examples of suitable blocked alkali solubilizing groups include, but are not limited to, t-butyl esters, alpha alkoxy esters, alpha alkoxyalkyl aromatic ethers, t-butoxyphenyl, t-butoxyimido, and t-butoxymethylimido. Examples of blocked alkali solubilizing groups can be found in U.S. Pat. Nos. 5,468,589; 4,491,628; 5,679,495; 6,379,861; 6,329,125; and 5,206,317, which are incorporated by reference herein.

Suitable polymers for the imaging layer are those which contain both silicon and blocked alkali solubilizing groups. Suitable polymers are those with silicon content of about 5% to about 30% silicon by weight. Preferred polymers are those with silicon content from about 8% to about 25% silicon. Examples of suitable photoresist polymers can be found in U.S. Pat. Nos. 6,146,793; 6,165,682; 6,340,734; 6,028,154; 6,042,989; 5,882,844; 5,691,396; 5,731,126; and 5,985,524, which are incorporated by reference herein. Other suitable polymers are disclosed, for example, in U.S. Published Patent Application Nos. 2001/0041769 and 2002/0055550, U.S. patent application Ser. No. 09/576,146 and JP2001114835, all which are incorporated by reference herein. The silicon content may be contained in the polymer before coating as in the above references or the polymer may be silylated after coating as in U.S. Pat. Nos. 6,306,990 and 6,110,637, which are incorporated by reference herein.

In addition to the silicon-containing polymer, chemically amplified photoresists suitable for this invention will also comprise photoacid generators. Any suitable photoacid generator compound may be employed in the radiation sensitive photoresist compositions. Examples of suitable photoacid generators include, but are not limited to, iodonium, sulfonium, or other onium salts, which decompose in the presence of light to yield acids; oxime sulfonates; nitrobenzyl esters of carboxylic or sulfonic acids; alkyl halides or gem-dihalides, which release halo acids.

Preferred photoacid generators are those generating sulfonic acids. Suitable classes of photoacid generators generating sulfonic acids include, but are not limited to, sulfonium or iodonium salts, oximidosulfonates, bissulfonyldiazomethane compounds, and nitrobenzylsulfonate esters. Suitable photoacid generator compounds are disclosed, for example, in U.S. Pat. Nos. 5,558,978 and 5,468,589, which are incorporated by reference herein. Particularly preferred are di-aryl or di-alkyl iodonium salts of strong acids or triaryl, diarylalkyl, dialkylaryl, or trialkyl substituted sulfonium salts of sulfonic acids.

Suitable examples of photoacid generators include, but are not limited to, triphenylsulfonium bromide, triphenylsulfonium chloride, triphenylsulfonium iodide, triphenylsulfonium hexafluorophosphate, triphenylsulfonium hexafluoroarsenate, triphenylsulfonium trifluoromethanesulfonate, diphenylethylsulfonium chloride, phenacyldimethylsulfonium chloride, phenacyltetrahydrothiophenium chloride, 4-nitrophenacyltetrahydrothiopheniumn chloride, and 4-hydroxy-2-methylphenylhexahydrothiopyrylium chloride.

Additional examples of suitable photoacid generators for use in this invention include, but are not limited to, triphenylsulfonium perfluorooctanesulfonate, triphenylsulfonium perfluorobutanesulfonate, methylphenyldiphenylsulfonium perfluorooctanesulfonate, methylphenyldiphenysulfonium perfluorooctanesulfonate, 4-n-butoxyphenyidiphenylsulfonium perfluorobutanesulfonate, 2,4,6-trimethylphenyldiphenylsulfonium perfluorobutanesulfonate, 2,4,6-trimethylphenyldiphenylsulfonium benzenesulfonate, 2,4,6-trimethylphenyldiphenylsulfonium 2,4,6-triisopropylbenzenesulfonate, phenylthiophenyldiphenylsulfonium 4-dodecylbenzensulfonic acid, tris(-t-butylphenyl)sulfonium perfluorooctanesulfonate, tris(-t-butylphenyl)sulfonium perfluorobutanesulfonate, tris(-t-butylphenyl)sulfonium 2,4,6-triisopropylbenzenesulfonate, tris(-t-butylphenyl)sulfonium benzenesulfonate, and phenylthiophenyldiphenylsulfonium perfluorooctanesulfonate.

Examples of suitable iodonium salts for use in this invention include, but are not limited to, diphenyl iodonium perfluorobutanesulfonate, bis-(t-butylphenyl)iodonium perfluorobutanesulfonate, bis-(t-butylphenyl)iodonium perfluorooctanesulfonate, diphenyl iodonium perfluorooctanesulfonate, bis-(t-butylphenyl)iodonium benzenesulfonate, bis-(t-butylphenyl)iodonium 2,4,6-triisopropylbenzenesulfonate, and diphenyliodonium 4-methoxybenzensulfonate.

Further examples of suitable photoacid generators for use in this invention include, but are not limited to, bis(p-toluenesulfonyl)diazomethane, methylsulfonyl p-toluenesulfonyldiazomethane, 1-cyclo-hexylsulfonyl-1-(1,1-dimethylethylsulfonyl)diazomethane, bis(1,1-dimethylethylsulfonyl)diazomethane, bis(1-methylethylsulfonyl)diazomethane, bis(cyclohexylsulfonyl)diazomethane, 1-p-toluenesulfonyl-1-cyclohexylcarbonyidiazomethane, 2-methyl-2-(p-toluenesulfonyl)propiophenone, 2-methanesulfonyl-2-methyl-(4-methylthiopropiophenone, 2,4-methyl-2-(p-toluenesulfonyl)pent-3-one, 1-diazo-1-methylsulfonyl-4-phenyl-2-butanone, 2-(cyclohexylcarbonyl-2-(p-toluenesulfonyl)propane, 1-cyclohexylsulfonyl-1cyclohexylcarbonyldiazomethane, 1-diazo-1-cyclohexylsulfonyl-3,3-dimethyl-2-butanone, 1-diazo-1-(1,1-dimethylethylsulfonyl)-3,3-dimethyl-2-butanone, 1-acetyl-1-(1-methylethylsulfonyl)diazomethane, 1-diazo-1-(p-toluenesulfonyl)-3,3-dimethyl-2-butanone, 1-diazo-1-benzenesulfonyl-3,3-dimethyl-2-butanone, 1-diazo-1-(p-toluenesulfonyl)-3-methyl-2-butanone, cyclohexyl 2-diazo-2-(p-toluenesulfonyl)acetate, tert-butyl 2-diazo-2-benzenesulfonylacetate, isopropyl-2-diazo-2-methanesulfonylacetate, cyclohexyl 2-diazo-2-benzenesulfonylacetate, tert-butyl 2 diazo-2-(p-toluenesulfonyl)acetate, 2-nitrobenzyl p-toluenesulfonate, 2,6-dinitrobenzyl p-toluenesulfonate, and 2,4-dinitrobenzyl p-trifluoromethylbenzene-sulfonate.

The photoacid generator compound is typically employed in amounts between about 0.0001% to about 20% by weight of polymer solids and more preferably between about 1% to about 10% by weight of polymer solids. Preferred photoacid generators are sulfonium salts. The photoacid generator may be used alone or in combination with one or more photoacid generators. The percentage of each photoacid generator in photoacid generator mixtures is between about 10% to about 90% of the total photoacid generator mixture. Preferred photoacid generator mixtures include about 2 or about 3 photoacid generators. Such mixtures may be of the same class or different classes. Examples of preferred mixtures include, but are not limited to, sulfonium salts with bissulfonyldiazomethane compounds, sulfonium salts and imidosulfonates, and two sulfonium salts.

The choice of solvent for the imaging layer, and the concentration thereof, depends principally on the type of functionalities incorporated in the acid labile polymer, the photoacid generator, and the coating method. The solvent should be inert, should dissolve all the components in the photoresist, should not undergo any chemical reaction with the components and should be re-removable on drying after coating. Suitable solvents for the photoresist composition may include, but are not limited to, ketones, ethers and esters, such as methyl ethyl ketone, methyl isobutyl ketone, 2-heptanone, cyclopentanone, cyclohexanone, 2-methoxy-1-propylene acetate, 2-ethoxyethyl acetate, 1-methoxy-2-propyl acetate, 1,2-dimethoxy ethane, ethyl acetate, cellosolve acetate, propylene glycol monoethyl ether acetate, methyl pyruvate, ethyl pyruvate, methyl 3-methoxypropionate, ethyl 3-methoxypropionate, N-methyl-2-pyrrolidone, 1,4-dioxane, diethylene glycol dimethyl ether, and the like, or any combinations thereof.

Base additives may be added to the imaging layer. The purpose of the base additive is to scavenge protons present in the photoresist prior to being irradiated by the actinic radiation. The base prevents attack and cleavage of the acid labile groups by the undesirable acids, thereby increasing the performance and stability of the resist. The percentage of base in the composition should be significantly lower than the photoacid generator because it would not be desirable for the base to interfere with the cleavage of the acid labile groups after the photoresist composition is irradiated. The preferred range of the base compounds, when present, is about 3% to about 50% by weight of the photoacid generator compound. Examples of useful bases include, but are not limited to, alkyl amines, cyclic amine, or salts of hydroxide ions. Suitable examples of base additives include, but are not limited to, 2-methylimidazole, triisopropylamine, 4-dimethylaminopryidine, 4,4'-diaminodiphenyl ether, 2,4,5-triphenylimidazole, tetrabutyl ammonium hydroxide and 1,5-diazobicyclo[4.3.0]non-5-ene.

Underlayers useful in this invention are organic films cast, in a preferred embodiment, on the substrate. General characteristics of the underlayers include having good solvent solubility, good film forming properties, adhesion with the imaging layer and no intermixing with the imaging layer when the imaging layer is processed. Good solvent solubility is useful for product shelf life and removal of material from the edge of substrates (edge bead removal). The good solvent solubility and no intermixing properties are typically difficult to achieve simultaneously. To avoid intermixing problems, the underlayer is frequently crosslinked by application of ultraviolet light or application of heat. In preferred embodiments, the refractive index and absorbance are optimized for the particular wavelength of exposure by adjustment of monomer structure and composition. Examples of suitable undercoats include those prepared by heating diazonaphthoquinone/novolac photoresists to high temperature and crosslinked polymers comprising hydroxystyrene. Suitable examples of undercoats are disclosed in U.S. Pat. Nos. 6,323,287; 6,054,248; 5,985,524; 6,610,808; EP1048980; EP1172695; and U.S. Published Patent Application No. 2002/0028409, each of which is incorporated by reference herein.

The underlayer is typically applied by spin or spray coating on coating track equipment with automatic wafer handlers. About 0.5 ml to about 5 ml of the underlayer is applied either before the wafer starts to spin (static) or while it is slowly rotating at spin speeds of about 100 rpm to about 1000 rpm (dynamic application). The substrate then is accelerated to a final spin speed of about 1000 rpm to about 5000 rpm depending on wafer size and desired underlayer film thickness. Thicknesses will depend on the specific application, but will typically range from about 150 nm to about 2 microns. This final spin is long enough to partially dry the film. Typical spin times are about 20 seconds to about 40 seconds. Further drying and curing in the case of a cross-linkable underlayer may be accomplished on a track hot plate at temperatures of about 100° C. to about 300° C. Alternatively, the drying of the underlayer can be done by convection heating in an oven or by IR curing in a microwave oven. This prepares the substrate/underlayer stack for further processing.

After cooling of the underlayer coated substrate, the imaging layer is applied in a similar fashion. Typical bake conditions for the imaging layer drying are about 30 seconds to about 120 seconds at temperatures of about 90° C. to about 150° C. on a hot plate. Other conventional means of drying known to those skilled in the art may be employed. This prepares the substrate/underlayer/imaging layer stack for further processing.

The substrate/underlayer/imaging layer stack is exposed imagewise. The term 'imagewise' exposure includes both exposure through a photomask containing a predetermined pattern, exposure by means of a computer controlled laser beam, which is moved over the surface of the coated substrate, exposure by means of computer-controlled electron beams, and exposure by means of X-rays or UV rays through a corresponding mask.

Radiation sources, which can be used, are all sources that emit radiation to which the photoacid generator is sensitive. Examples include high pressure mercury lamp, KrF excimer lasers, ArF excimer lasers, electron beams and x-rays sources. The radiation is preferably of about 248 nm or less.

After exposure, the imaging layer is commonly subject to heating and developing steps. With the aid of this heat treatment, known as "post-exposure bake", virtually complete reaction of the acid labile groups in the polymer resin with the acid generated by the exposure is achieved. The duration and temperature of this post-exposure bake can vary within broad limits and depend essentially on the functionalities of the polymer resin, the type of acid generator and on the concentration of these two components. The exposed resist is typically subjected to temperatures of about 50° C. to about 150° C. for a few seconds to a few minutes. The preferred post exposure bake is from about 80° C. to about 130° C. for about 5 seconds to about 300 seconds.

After imagewise exposure and any heat treatment of the material, the exposed areas of the photoresist are removed by dissolution in a developer. The choice of the particular developer depends on the type of photoresist; in particular on the nature of the polymer resin or the photolysis products generated. The developer can include aqueous solutions of bases to which organic solvents or mixtures thereof may have been added. Particularly preferred developers are aqueous alkaline solutions. These include, for example, aqueous solutions of alkali metal silicates, phosphates, hydroxides and carbonates, but in particular of tetra alkylammonium hydroxides, and more preferably tetramethylammonium hydroxide (TMAH). If desired, relatively small amounts of wetting agents and/or organic solvents can also be added to these solutions.

In the manufacture of devices, problems invariably occur which require correction. Examples of such problems include, but are not limited to, having incorrect imaging layer thickness and having incorrect dimensions for lines or trenches. In such situations, the imaging layer needs to be removed and the imaging step repeated. Preferably, this is done without significant loss of underlayer thickness, loss of adhesion between the underlayer and the last imaging layer coated, changes in surface energy or index of refraction of the underlayer or imaging properties. Moreover, depending on when the problem(s) occur during the manufacturing process, the imaging layer may be unexposed or may have been exposed to radiation (and developed). Whether or not the imaging layer has been exposed will dictate the solvent or blend of solvent used to remove the image layer. Nonetheless, the imaging layer solvent must be optimized in this regard.

In the process of this invention, the imaging layer is removed by contacting the imaging layer with an imaging layer removal solvent comprised of at least one solvent selected from the group consisting of: glycol ethers, ketones, esters, lactates, dimethylsulfoxide (DMSO), dimethylformamide (DMF), tetrahydrofuran (THF), methyl tetrahydrofuran, dioxane, tetrahydropyran, ethyl tetrahydropyran-4-acetate, methyl tetrahydropyran-4-methanol, tetrahydropyran-4-one, n-butyl acetate, and n-amyl acetate. This may take place at any step subsequent to the image layer coating step and prior to a plasma etch step. Suitable solvents or mixtures thereof must be liquid at room temperature and it is desirable for each to have a boiling point of less than about 250° C. Suitable imaging layer removal solvents or mixtures thereof should dissolve the imaging layer without significant dissolution of the underlayer. When the underlayer is used as an etch mask it is desirable that the underlayer loss due to rework is less than 10% of the original underlayer thickness.

Suitable glycol ether solvents include, but are not limited to, propylene glycol mono methyl ether (PGME), and various glycol ether esters such as propylene glycol mono methyl ether acetate (PGMEA), ethylene glycol mono methyl ether acetate (EGMEA), propylene glycol ethyl ether acetate (PGEEA), and propylene glycol mono methyl ether propionate (Methotate).

Suitable ester solvents, which are not glycol ether ester solvents, include, but are not limited to, ethoxy ethyl propionate, n-butyl acetate, n-amyl acetate, ethyl tetrahydropyran-4-acetate, and lactate esters. Other suitable ester solvents are lactate solvents, which include, but are not limited to, methyl lactate, ethyl lactate, propyl lactate, butyl lactate, and 2-ethylhexyl lactate.

Suitable ketone solvents include, but are not limited to, acetone, methyl propyl ketone (MPK), 2-heptanone, cyclohexanone, cyclopentanone, methyl isobutyl ketone (MIBK), methyl isopropyl ketone (MIPK), and methyl ethyl ketone (MEK).

The imaging layer removal solvent may be a single solvent or a mixture of two or more suitable solvents and may be adjusted for specific imaging layer, underlayer compositions, and process. Relative concentrations of the suitable solvents in a mixture can range from about 1% to about 99%.

Preferred imaging layer removal solvents include ketones, esters, 2-heptanone, methyl propyl ketone, PGME, PGMEA, ethyl lactate, cyclohexanone, n-butyl acetate, tetrahydrofuran, methyl tetrahydrofuran, glycol mono ethers, and mixtures of ketones or esters or glycol monoether solvents with one or more other solvents.

More preferred imaging layer removal solvents include 2-heptanone, cyclohexanone, n-butyl acetate, PGME, PGMEA, ketone mixtures where the ketone comprises >50% of the imaging layer removal solvent, glycol mono ether solvents where the glycol mono ether solvent comprises >50% of the imaging layer removal solvent, and ternary or higher mixtures of ketones, glycol mono ethers, and glycol monoether esters.

Most preferred imaging layer removal solvents include 2-heptanone, cyclohexanone, n-butyl acetate, PGME, PGMEA, a solvent mixture comprising a ketone (70%–90%) and a lactate (10%–30%), a solvent mixture comprising a glycol monoether (70%–95%) and a lactate (5%–30%), and a solvent mixture comprising 50%–70% glycol monoether, 1%–20% ketone, and 5%–35% glycol monoether ester.

Contacting the imaging layer with the imaging layer removal solvent may be done in any suitable manner. The contacting may be done, for example, by immersion of the substrate/underlayer/imaging layer stack into a container containing the imaging layer removal solvent. The substrate/underlayer/imaging layer stack or the imaging layer removal solvent may be agitated or static during the contact period. In another embodiment, the substrate/underlayer/imaging layer stack may be resting on or attached to a chuck on a semiconductor track. The substrate/underlayer/imaging layer stack may be oriented parallel, perpendicular, or at any other angle with respect to the floor. The solvent may be applied by any method to the substrate/underlayer/imaging layer stack. Suitable methods would include pouring, streaming, or spraying the solvent onto the substrate/underlayer/imaging layer stack. The substrate/underlayer/imaging layer stack may be rotating or static on the chuck.

The imaging layer removal solvent should be in contact with the imaging layer for a time period necessary for the imaging layer to dissolve in the imaging layer removal solvent. Suitable time periods include about 10 seconds up to about 20 minutes. Preferred contact time periods are about 30 seconds to about 5 minutes depending on the contacting method used. At contact time the imaging layer removal solvent can be at any temperature as long as it does not contribute to changes of underlayer characteristic and the imaging layer removal solvent is in its liquid form. Preferably, this temperature is room temperature or about 18° C. to about 25° C. During the contact time, the imaging layer of the substrate/underlayer/imaging layer stack is preferably fully immersed or in thorough contact with the imaging layer removal solvent. For one embodiment in a bath environment the imaging layer removal solvent is provided in an amount to allow full immersion. In another embodiment, for semiconductor track applications, the amount of imaging layer removal solvent depends on the duration of the solvent application time and the dispense rate. Typically, dispense volumes are about 20 ml to about 100 ml.

Subsequent to the contacting of the imaging layer removal solvent with the imaging layer, the imaging layer removal solvent containing the dissolved imaging layer must be removed from the resultant substrate/underlayer stack. This may take place by any suitable method or combination of methods. Suitable methods of removal include spinning the wet substrate/underlayer stack at about 1000 rpm to about 5000 rpm for about 10 seconds to about 120 seconds. In another embodiment, the imaging layer removal solvent containing the dissolved imaging layer may be removed by a rinse of additional imaging layer removal solvent. This may be done by any of the imaging layer removal solvent contact methods described above. In a third embodiment, the imaging layer removal solvent containing the dissolved imaging layer may be removed by a rinse with water. In a fourth embodiment, after removing the imaging layer removal solvent containing the dissolved imaging layer by spinning, a solvent or water rinse may be employed. This can be done in a dump rinse bath. The water or solvent is drained from the bath with subsequent refilling one to five times. Enough water or solvent must be used to fully immerse the substrate/underlayer stack. Alternatively, any of the imaging layer removal solvent contact methods described above may be used.

Subsequent to the removal of the imaging layer removal solvent containing the imaging layer, residual solvent or water should be removed. Suitable methods include, but are not limited to, spin drying, ambient air drying, baking in an oven, baking on a hot plate, baking under an infrared source, and flowing of a gas, such as air or nitrogen over the surface of the wafer. Combinations of suitable methods may be used. If heat is used, then care must be taken not to thermally alter the underlayer of the substrate/underlayer stack. Temperatures used are typically between the boiling point of water or the imaging layer removal solvent and the cure temperature of the underlayer used in the substrate/underlayer/imaging layer stack. Preferred temperatures are between about 100° C. and 205° C.

After cooling, the substrate/underlayer stack is ready to recoat an imaging layer using methods described above. The processes of the invention may be repeated multiple times until the desired result of the imaging process is obtained.

In yet another embodiment of the invention, a coated substrate comprising the substrate/underlayer/imaging layer stack prepared by the process described in the second embodiment is envisioned.

The invention is illustrated by, but not limited to, the following examples in which the parts and percentages are by weight, unless otherwise specified.

EXAMPLES

General Procedure 1

Substrate/Underlayer/Imaging Layer Preparation:
1. The underlayer was applied onto an 8" silicon wafer (Substrate) by spin coating, followed by a proximity bake to evaporate most of the casting solvent and thermally cross-link the underlayer at 205° C. for 70 seconds on a DNS 80 coating track. The underlayer used was TIS 248UL-01-50 commercially available from Arch Chemicals, Inc. The spin speed was adjusted to achieve a coating thickness of 5000 Å after baking. The proximity gap on the DNS 80 was 0.15 mm.
2. The imaging layer was applied onto the substrate/underlayer stack by spin coating, followed by a proximity soft bake at 135° C. for 90 seconds on a DNS 80 coating track. The imaging layer used was TIS 248IL-01-23 commercially available from Arch Chemicals, Inc. The spin speed was adjusted to achieve a coating thickness of 2350 Å after baking. The proximity gap on the DNS 80 was 0.15 mm.
3. The substrate/underlayer/imaging layer stack was pattern wise exposed with a focus exposure array to 248 nm radiation on a Canon EX6 stepper using ⅔ annular illumination with a Numerical Aperture (NA) of 0.65. Exposures were done through a dark field mask containing equal line/space test patterns with dimensions ranging from 500 to 1250 nm. After going through a five times reduction lens in the stepper, this results in images of 100 to 250 nm on the wafer plane.
4. The exposed substrate/underlayer/imaging layer stack was post exposure baked (PEB) at 125° C. for 90 seconds on a proximity hot plate on a DNS 80 develop track. The proximity gap on the DNS 80 hot plate was 0.15 mm.
5. The imaging layer in the exposed areas of the substrate/underlayer/imaging layer stack was removed by a 7 second stream/58 second puddle development process at a controlled temperature of 18° C. using OPD 262, a TMAH type developer commercially available from Arch Chemicals, Inc. The development process was performed on a DNS 80 developer track.

Examples Use Either Rework Process A, B or C

Rework Process A—Batch Process
1. The unexposed areas of the imaging layer were removed from the substrate/underlayer/imaging layer stack by dipping them into a beaker containing about 1 gallon of the imaging layer removal solvent for 5 minutes at room temperature (21° C.). One or two substrates at a time were placed in a wafer boat and the substrates were completely immersed horizontally. The boat, however, was not completely immersed and was moved by hand in an upward and downward motion by about one inch at a frequency of about 30 times per minute providing gentle agitation.
2. The wafer boat containing the substrate/underlayer stacks from step 1 were subsequently transferred into a dump rinse station from Plastic Design. Then they went through 3 cycles of dump rinses. A dump rinse consisted of immersing the entire wafer boat in de-ionized water, draining the bath quickly from the bottom in less than a minute, and re-filling the bath by spraying de-ionized water from the top of the bath. In this fill operation de-ionized water is sprayed over the wafer boat, never allowing the substrates to dry.
3. The substrate/underlayer stacks from step 2 were transferred into a Semitool spin rinse dryer where they were rinsed again with de-ionized water while rotating at 500 rpm for 2 minutes and dried under heated blowing Nitrogen while rotating at 1500 rpm for 3.25 minutes.
4. The substrate/underlayer stacks from step 3 had residual water removed by a dehydration bake on a proximity hot plate module in the DNS 80 coating track. Hot plate conditions are defined in the examples. The proximity gap on the DNS 80 hot plate was 0.15 mm.
5. The substrate/underlayer stacks were then used for re-imaging.

Rework Process B—Single Wafer Mode
1. The unexposed areas of the imaging layer were removed from the substrate/underlayer/imaging layer stack by horizontally spinning the substrate on a chuck at 1500 rpm while streaming about 50 ml of imaging layer removal solvent at a rate of 2 ml per seconds onto the center of the substrate. The coating chuck of the DNS 80 track was used for this purpose.
2. The substrate/underlayer stack from step 1 was dried by spinning the substrate on the a chuck at 3000 rpm for 20 seconds.

3. The substrate/underlayer stacks were then used for re-imaging.

Rework Process C—Batch Process, Similar to Rework Process A
1. The unexposed areas of the imaging layer were removed from the substrate/underlayer/imaging layer stack by dipping them into a beaker containing enough imaging layer removal solvent to vertically immerse one substrate/underlayer/imaging layer stack at a time for a total of 2 minutes at room temperature (21° C.). The substrate/underlayer/imaging layer stack was completely immersed for a 10 seconds period and then completely removed from the imaging layer removal solvent by pulling the substrate/underlayer/imaging layer stack out in a vertical upwards motion and then within 1–2 seconds re-immersed into the imaging layer removal solvent. For the remainder of the imaging layer removal time the substrate/underlayer/imaging layer was gently agitated by small horizontal and vertical movements of the substrate/underlayer/imaging layer stack. Most of the imaging layer was removed from the substrate/underlayer/imaging layer stack during the first 10 seconds.
2. The substrate/underlayer stack was removed from the imaging layer removal solvent bath and held under a stream of de-ionized water allowing the water to flow mainly over the side of the substrate coated with the underlayer for two minutes to rinse off the imaging layer containing imaging layer removal solvent.
3. Subsequently, the substrate/underlayer stack from step 2 was dried by blowing the water off the substrate with nitrogen.
4. The substrate/underlayer stack from step 3 had residual water removed by a de-hydration bake on a proximity hot plate module in the TEL ACT8 coating track. Hot plate conditions varied and are defined in the examples. The proximity gap on the TEL ACT8 plate was 0.10 mm.
5. The substrate/underlayer stacks were then used for re-imaging.

Re-imaging
1. Substrate/underlayer stack from the rework process was imaged as described in substrate preparation steps 2–5.

Inspection
1. Substrates were carefully cleaved through the imaged dense trenches, sputter coated with gold, and inspected under a field emission type scanning electron microscope (FE-SEM). Cross-section views of SEM pictures were obtained to evaluate line profile quality. Trench widths were measured and compared to mask trench width after stepper reduction.

Comparative Example 1

This example examines lithographic behavior of the substrate/underlayer/imaging layer stack without having gone through a rework cycle. Therefore, only the substrate/underlayer/imaging layer preparation and inspection steps of General Procedure 1 were performed.

Examples 1–8

Examples 1–8 illustrate the rework process with General Procedure 1 for different imaging layer removal solvents. For these examples rework process A with a de-hydration bake of 100° C. for 90 seconds was carried out.

TABLE 1

Imaging layer removal solvents used and results

| Example # | Solvent | Solvent Ratio [weight %] | *ΔCD of 140 nm trench (1:1)[%] | Profile |
|---|---|---|---|---|
| Comp. 1 | none | N/A | 0% | Square tops, no scumming |
| 1 | PGME/PGMEA/MPK | 69.5/29.5/1.0 | +0.7% | Square tops, no scumming |
| 2 | PGMEA/EL | 90/10 | +2.1% | Square tops, no scumming |
| 3 | PGMEA/MPK | 99/1 | +18% | Footing and scumming |
| 4 | PGMEA | 100 | +12% | Footing and scumming |
| 5 | Cyclohexanone | 100 | +1.8% | Square tops, no scumming |
| 6 | Tetrahydrofuran | 100 | +4.0% | Square tops, no scumming |
| 7 | n-butyl Acetate | 100 | +3.8% | Square tops, no scumming |
| 8 | PGMEA/DMSO | 70/30 | +4.0% | Square tops, no scumming |

*Difference of trench width to comparative example 1

These results illustrate that lithography after rework is affected differently by different imaging layer removal solvents.

Example 9

This example illustrates the rework process in single wafer mode on track equipment readily available in a semiconductor fabrication plant, without water rinse or de-hydration-bake.

General Procedure 1 was followed with rework process B and PGMEA as imaging layer removal solvent. This process resulted in after rework images similar to comparative example 1, without scumming or footing. There was, however, some noise in the process and not all wafers were scum free. Trench width of 140 nm trenches after rework were within 3% of the trench width before rework (comparative example 1).

Example 10

This example examines the rework process at a high dehydration bake temperature.

General Procedure 1 was followed with rework process A and PGMEA as imaging layer removal solvent. A 70 second dehydration bake at 205° C. was employed. The dehydration bake condition was chosen to be identical to the curing conditions for the underlayer.

Acceptable profiles were observed after re-work and the trench width difference to comparative example 1 was −0.7%. This shows that higher dehydration bake temperatures may be preferred for some solvents (compared to example 4).

Examples 11–15

These examples examine various single component solvent systems for the imaging layer rework process.

General Procedure 1 with rework process A was followed with a 70 second dehydration bake at 205° C. For these examples underlayer thickness loss due to the solvent imaging layer removal step was measured in addition to trench width after rework.

TABLE 2

Single Solvent imaging layer removal

| Example # | Solvent | *ΔCD of 140 nm trench (1:1) | underlayer thickness loss [Å] | 140 nm line Profile |
|---|---|---|---|---|
| 11 | Ethyl Lactate | −13.5% | 16 | Square tops, sloped |
| 12 | DMSO | Did not clear | 23 | Square tops, footing (150 nm lines) |
| 13 | 2-Heptanone | 0% | 21 | Square tops, no scumming |
| 14 | MPK | 9% | 82 | Square tops, no scumming |
| 15 | PGMEA | 0% | 18 | Square tops, no scumming |

*Difference of trench width to comparative example 1

FIG. 1 shows that all solvents tested were useful for reworking trenches with trench widths equal to or larger than 150 nm. 2-heptanone and PGMEA are preferred when re-imaging sub 150 nm features.

Comparative Example 2

This example examines lithographic behavior of the substrate/underlayer/imaging layer stack without having gone through a rework cycle. This example employs thicker underlayer and imaging layer coatings.

Substrate preparation from General Procedure 1 was followed with the following exceptions: the underlayer was coated to a film thickness of 5500 Å. The cure process for the underlayer was 205° C. for 105 seconds. The coating thickness for the imaging layer was 3000 Å. All coating and developing processes were carried out on a TEL ACT8 coating track. All baking operations on this track employed a 0.10 mm proximity gap. 248 nm exposures were done on an ASM-L 5500/750 stepper with conventional illumination with a numerical aperture of 0.63 and sigma of 0.5. This stepper was outfitted with four times reduction lenses.

Feature side wall angles at optimum focus and exposure energy conditions for 200 nm dense trenches were determined on a cross-sectional JEOL JFM-6401F SEM.

In addition, top down analysis of the imaging layer was done on a Hitachi 9200 SEM to determine imaged dimensions for 200 nm isolated and dense trenches over a range of exposure energies and focal positions.

Examples 16–18

These examples studied the influence of dehydration bake temperatures on 200 nm trench image quality after 248 nm bi-layer imaging layer rework. A mixture of 69.5 wt % PGME, 29.5 wt % PGMEA, and 1 wt % MPK was used as imaging layer removal solvent.

Processes as described in comparative example 2 were followed with the following exception: the imaging layer of the substrate underlayer/imaging layer stack was removed with rework process C in General Procedure 1 and re-imaging before inspection was done following the substrate/underlayer/imaging layer stack preparation starting with the imaging layer coating step.

TABLE 3

Influence of dehydration bake temperature on image sidewall profile

| Example # | dehydration bake conditions | 200 nm trench profile rating (1) |
|---|---|---|
| Comp. 2 | None | **** |
| 16 | 90 seconds @ 105° C. | ** |
| 17 | 90 seconds @ 150° C. | *** |
| 18 | 90 seconds @ 180° C. | **** |

(1) profile rating of side wall angel of dense 140 nm trench.
***** is equivalent to 90° angle Increasing the dehydration bake temperature above the boiling point of the solvents used improved the sidewall profiles of the re-imaged structures.

Example 19

This example studies lithographic behavior after multiple rework operations for a 248 nm bi-layer system. A mixture of 69.5 wt % PGME, 29.5 wt % PGMEA, and 1 wt % MPK was used as imaging layer removal solvent.

The images were generated in the same manner as in examples 12–14 using a dehydration bake process of hot plate baking at 180° C. for 90 seconds.

Overlapping exposure latitude (EL) was defined as the percent of over or under exposure that can be tolerated in the image generation process while both dense and isolated target feature sizes of 200 nm trenches resulted in actual image sizes in the range of 180 and 220 nm. Similarly, overlapping Depth of Focus (DOF) is defined as the allowable defocal range resulting in 180 to 220 nm isolated and dense trenches in the imaging layer. An overlapping process window is defined as the area on a focus/exposure graph that results in 180 to 220 nm isolated and dense trenches in the imaging layer.

Re-work, re-imaging, and inspection was done a total of three times.

TABLE 4

Overlapping Focus/Exposure windows after multiple rework operations

| # times reworked | Overlapping EL | Overlapping DOF |
|---|---|---|
| Comp example 2 - (no rework) | 10% | 0.46 μm |
| 1 times | 10% | 0.40 μm |
| 2 times | 10% | 0.43 μm |
| 3 times | 10% | 0.51 μm |

Similar overlapping process windows to Comparative Example 2 were found after each processing step (see table 4).

Comparative Example 3

This example examines lithographic behavior of the substrate/underlayer/imaging layer stack without having gone through a re-work cycle. This example utilizes a 193 nm exposure wavelength to image the imaging layer.

Substrate preparation from General Procedure 1 was followed with the following exception: The underlayer used in this example was TIS 193UL-51-50 and coated to a film thickness after cure of 4000 Å. The cure process for the underlayer was 205° C. for 105 seconds. The imaging layer used in this example was TIS 193IL-51-23 and coating to a film thickness of 2350 Å after baking. All coating and developing processes were carried out on a TEL ACT8 coating track. All baking operations on this track employed a 0.10 mm proximity gap. 193 nm exposures through a bright field mask were done on an ASM-L 5500/950 stepper with conventional illumination with a numerical aperture of 0.63 and sigma of 0.5. This stepper was outfitted with 4× reduction lenses.

Feature side wall angles at optimum focus and exposure energy conditions for 150 nm dense line/space pairs were determined on a cross-sectional JEOL JFM-6401F SEM.

In addition, top down analysis of the imaging layer was done on a Hitachi 9200 SEM to determine imaged dimensions for 150 nm isolated and dense line/space pairs over a range of exposure energies and focal positions. For results see Table 5.

Examples 20–22

These examples studied the influence of dehydration bake temperatures on equal line/space image quality after 193 nm bi-layer imaging layer rework. A mixture of 69.5 wt. % PGME, 29.5 wt. % PGMEA, and 1 wt. % MPK was used as imaging layer removal solvent.

Processes as described in comparative example 3 were followed with the following exception: the imaging layer of the substrate/underlayer/imaging layer stack was removed with rework in General Procedure 1 and re-imaging before inspection was done following the substrate/underlayer/imaging layer stack preparation starting with the imaging layer coating step.

TABLE 5

Influence of dehydration bake temperature on image sidewall profile

| Example # | dehydration bake conditions | 150 nm line profile rating[1] |
|---|---|---|
| Comp 1 | none | *** |
| 20 | 90 seconds @ 105° C. | *** |
| 21 | 90 seconds @ 150° C. | *** |
| 22 | 90 seconds @ 180° C. | **** |

[1]profile rating of side wall angel of dense 140 nm trench.
***** is equivalent to 90° angle Increasing the dehydration bake temperature above the boiling point of the solvents used improved the sidewall profiles of the re-imaged structures.

Example 23

This example studies lithographic behavior after multiple rework operations for a 193 nm bi-layer system. A mixture of 69.5 wt. % PGME, 29.5 wt. % PGMEA, and 1 wt. % MPK was used as imaging layer removal solvent.

The images were generated in the same manner as in examples 16–18 using a dehydration bake process of hot plate baking at 180° C. for 90 seconds.

Overlapping exposure latitude (EL) was defined as the percent of over or under exposure that can be tolerated in the image generation process while both dense and isolated target feature sizes of 150 nm line/space pairs resulted in actual image sizes in the range of 135 and 165 nm. Similarly, overlapping Depth of Focus (DOF) is defined as the allowable defocal range resulting in 135 to 165 nm isolated and dense line/space pairs in the imaging layer. An overlapping process window is defined as the area on a focus/exposure graph that results in 135 to 165 nm isolated and dense line/space pairs in the imaging layer.

Re-work, re-imaging, and inspection was done a total of three times. Similar overlapping process windows to comparative example 3 were found after each processing step (see Table 6).

TABLE 6

Overlapping Focus/Exposure windows after multiple rework operations

| # times reworked | Overlapping Exposure Latitude (EL) | Overlapping Depth of Focus (DOF) |
|---|---|---|
| none | 8% | 0.033 µm |
| 1 times | 8% | 0.033 µm |
| 2 times | 8% | 0.033 µm |
| 3 times | 8% | 0.31 µm |

While we have shown and described several embodiments in accordance with our invention, it is to be clearly understood that the same are susceptible to numerous changes apparent to one skilled in the art. Therefore, we do not wish to be limited to the details shown and described but intend to show all changes and modifications that come within the scope of the appended claims.

What is claimed is:

1. A rework process for removing an imaging layer from a substrate stack, the stack comprising a substrate, an organic underlayer adjacent to said substrate, and an imaging layer comprising silicon adjacent to said organic underlayer, said process comprising the steps of:
    (a) contacting said substrate stack with an imaging layer removal solvent;
    (b) removing said imaging layer with said imaging layer removal solvent thereby forming an organic substrate/underlayer stack, wherein said imaging layer removal solvent is selected from the group consisting of: glycol ethers, ketones, esters, lactates, dimethylsulfoxide (DMSO), dimethylformamide (DMF), tetrahydrofuran (THF), methyl tetrahydrofuran, dioxane, tetrahydropyran, ethyl tetrahydropyran-4-acetate, methyl tetrahydropyran-4-methanol, tetrahydropyran-4-one, n-butyl acetate, n-amyl acetate, and any combinations thereof; and
    (c) removing said imaging layer removal solvent from said organic substrate/underlayer stack after said imaging layer is removed.

2. The rework process of claim 1, wherein said substrate is selected from the group consisting of: silicon, nitrides, oxides, oxynitrides, inorganic derivatives of silicon, coatings of nitrides, metals, low k dielectric coatings, copper, aluminum, tungsten, low-k organic materials, carbon-doped silicon, carbon-doped oxide, and any combinations thereof.

3. The rework process of claim 1, wherein said underlayer is one or more organic films.

4. The rework process of claim 1, wherein said imaging layer is a chemically amplified photoresist.

5. The rework process of claim 1, wherein said imaging layer on said substrate stack has not been exposed to radiation.

6. The rework process of claim 1, wherein said imaging layer on said substrate stack has been exposed to a radiation source and a developer.

7. The rework process of claim 1, wherein said imaging layer removal solvent is selected from the group consisting of: ketones, esters, 2-heptanone, methyl propyl ketone, PGME, PGMEA, ethyl lactate, cyclohexanone, n-butyl acetate, tetrahydrofuran, methyl tetrahydrofuran, glycol mono ethers, and any combinations thereof.

8. The rework process of claim 1, wherein said imaging layer removal solvent is selected from the group consisting of: 2-heptanone, cyclohexanone, n-butyl acetate, PGME, PGMEA, ketone mixtures where the ketone comprises greater than 50% of the imaging layer removal solvent, glycol mono ether solvent where the glycol mono ether solvent comprises greater than 50% of the imaging layer removal solvent, ternary or higher mixtures of ketones, glycol mono ethers, and glycol monoether esters, and any combinations thereof.

9. The rework process of claim 1, wherein said imaging layer removal solvent is selected from the group consisting of: 2-heptanone, cyclohexanone, n-butyl acetate, PGME, PGMEA, a solvent mixture comprising about 70% to about 90% ketone and about 10% to about 30% lactate, a solvent mixture comprising about 70% to about 95% glycol monoether and 5% to about 30% lactate, a solvent mixture comprising about 50% to about 70% glycol monoether, about 1% to about 20% ketone, and about 5% to about 35% glycol monoether ester, and any combinations thereof.

10. The rework process of claim 1, wherein the contacting step of step (a) is carried out by a means selected from the group consisting of: immersion, disposition on a track, and any combination thereof.

11. The rework process of claim 10, wherein said contacting means is disposition on a track and said substrate stack has an orientation selected from the group consisting of: parallel, perpendicular, or angled with respect to a floor.

12. The rework process of claim 11, wherein said imaging layer removalsolvent is applied by a method selected from the group consisting of: streaming, spraying, and any combination thereof.

13. The rework process of claim 11, wherein said substrate stack is rotating on said track, static on said track, and any combination thereof.

14. The rework process of claim 1, wherein said imaging layer removal solvent contacts said imaging layer for about 30 seconds to about 5 minutes.

15. The rework process of claim 1, wherein said imaging layer removal solvent has a temperature between about 18° C. to about 25° C.

16. The rework process of claim 1, wherein said removal step of step (c) comprises a means selected from the group consisting of: spinning, rinsing, and any combinations thereof.

17. The rework process of claim 16, wherein said spinning means comprises spinning said substrate/underlayer stack at about 1000 rpm to about 5000 rpm for about 10 seconds to about 120 seconds.

18. The rework process of claim 16, wherein said rinsing means comprises water rinsing, additional imaging layer removal solvent rinsing, or any combinations thereof.

19. The rework process of claim 1, further comprising after step (c), a step of removing any residual water, residual solvent, and combinations thereof from the substrate/underlayer stack by a means selected from the group consisting of: spin drying, ambient air drying, baking, flowing a gas over a surface of said stack, and any combinations thereof.

20. The rework process of claim 19, wherein said baking means is selected from the group consisting of: oven baking, hot plate baking, infrared baking, and any combinations thereof.

21. The rework process of claim 20, wherein said baking is carried out at a temperature between about 100° C. and 205° C.

22. A lithographic imaging rework process for correcting one or more defects on an imaging layer on a substrate stack, said substrate stack comprising a substrate, an organic underlayer adjacent to said substrate, and an imaging layer comprising silicon adjacent to said underlayer, said process comprising the steps of:
(a) contacting said substrate stack with an imaging layer removal solvent selected from the group consisting of: glycol ethers, ketones, esters, lactates, dimethylsulfoxide (DMSO), dimethylformamide (DMF), tetrahydrofuran (THF), methyl tetrahydrofuran, dioxane, tetrahydropyran, ethyl tetrahydropyran-4-acetate, methyl tetrahydropyran-4-methanol, tetrahydropyran-4-one, n-butyl acetate, n-amyl acetate, and any combinations thereof;
(b) removing said imaging layer with said imaging layer removal solvent, thereby forming an organic substrate/underlayer stack;
(c) removing said imaging layer removal solvent from said organic substrate/underlayer stack after said imaging layer is removed;
(d) coating said substrate/underlayer stack with a new imaging layer;
(e) exposing said new imaging layer to radiation; and
(d) developing said new imaging layer.

23. The lithographic imaging rework process of claim 22, wherein said substrate is selected from the group consisting of: silicon, nitrides, oxides, oxynitrides, inorganic derivatives of silicon, coatings of nitrides, metals, low k dielectric coatings, low-k organic material, copper, aluminum, tungsten, carbon-doped oxide, carbon-doped silicon, and any combinations thereof.

24. The lithographic imaging rework process of claim 22, wherein said underlayer is one or more organic films.

25. The lithographic imaging rework process of claim 22, wherein said imaging layer is a chemically amplified photoresist.

26. The lithographic imaging rework process of claim 22, wherein said imaging layer on said substrate stack has not been exposed to radiation.

27. The lithographic imaging rework process of claim 22, wherein said imaging layer on said substrate stack has been exposed to a radiation source and a developer.

28. The lithographic imaging rework process of claim 22, wherein said imaging layer removal solvent is selected from the group consisting of: ketones, esters, 2-heptanone, methyl propyl ketone, PGME, PGMEA, ethyl lactate, cyclohexanone, n-butyl acetate, tetrahydrofuran, methyl tetrahydrofuran, glycol mono ethers, and any combinations thereof.

29. The lithographic imaging rework process of claim 22, wherein said imaging layer removal solvent is selected from the group consisting of: 2-heptanone, cyclohexanone, n-butyl acetate, PGME, PGMEA, ketone mixtures where the ketone comprises greater than 50% of the imaging layer removal solvent, glycol mono ether solvent where the glycol mono ether solvent comprises greater than 50% of the imaging layer removal solvent, ternary or higher mixtures of ketones, glycol mono ethers, and glycol monoether esters, and any combinations thereof.

30. The lithographic imaging rework process of claim 22, wherein said imaging layer removal solvent is selected from the group consisting of: 2-heptanone, cyclohexanone, n-butyl acetate, PGME, PGMEA, a solvent mixture comprising about 70% to about 90% ketone and about 10% to about 30% lactate, a solvent mixture comprising about 70% to about 95% glycol monoether and 5% to about 30% lactate, a solvent mixture comprising about 50% to about 70% glycol monoether, about 1% to about 20% ketone, and about 5% to about 35% glycol monoether ester, and any combinations thereof.

31. The lithographic imaging rework process of claim 22, wherein said contacting step of step (a) is carried out by a means selected from the group consisting of: immersion, disposition on a track, and any combination thereof.

32. The lithographic imaging rework process of claim 31, wherein said contacting means is disposition on a track and said substrate stack has an orientation selected from the group consisting of: parallel, perpendicular, or angled with respect to a floor.

33. The lithographic imaging rework process of claim 32, wherein said imaging layer removal solvent is applied by a method selected from the group consisting of: streaming, spraying, and any combination thereof.

34. The lithographic imaging rework process of claim 32, wherein said substrate stack is rotating on said track, static on said track, and any combination thereof.

35. The lithographic imaging rework process of claim 22, wherein said imaging layer removal solvent contacts said imaging layer for about 30 seconds to about 5 minutes.

36. The lithographic imaging rework process of claim 22, wherein said imaging layer removal solvent has a temperature between about 18° C. to about 25° C.

37. The lithographic imaging rework process of claim 22, wherein said removal step of step (c) comprises a means selected from the group consisting of: spinning, rinsing, and any combinations thereof.

38. The lithographic imaging rework process of claim 37, wherein said spinning means comprises spinning said substrate/underlayer stack at about 1000 rpm to about 5000 rpm for about 10 seconds to about 120 seconds.

39. The lithographic imaging rework process of claim 37, wherein said rinsing means comprises water rinsing, additional imaging layer removal solvent rinsing, and any combinations thereof.

40. The lithographic imaging rework process of claim 22, further comprising after step (c), a step of removing any residual water, residual solvent, and combinations thereof from the substrate/underlayer stack.

41. The lithographic imaging rework process of claim 40, wherein said residual water, residual solvent, and any combination thereof is removed from said substrate/underlayer stack by a means selected from the group consisting of: spin drying, ambient air drying, baking, flowing of a gas over a surface of said stack, and any combinations thereof.

42. The lithographic imaging rework process of claim 41, wherein said baking means is selected from the group consisting of: oven baking, hot plate baking, infrared baking, and any combinations thereof.

43. The rework process of claim 42, wherein said baking is carried out at a temperature between about 100° C. and 205° C.

44. The lithographic imaging rework process of claim 22, wherein said new imaging layer comprises silicon.

45. The lithographic imaging rework process of claim 22, further comprising, after step (d), the step of baking said new imaging layer.

46. The lithographic imaging rework process of claim 45, wherein said baking step is carried out for between about 30 seconds to about 120 seconds.

47. The lithographic imaging rework process of claim 45, wherein said baking step is done at a temperature between about 90° C. to about 150° C.

48. The lithographic imaging rework process of claim 22, wherein said new imaging layer is exposed imagewise, in step (e).

49. The lithographic imaging rework process of claim 22, wherein said radiation is derived from a radiation source selected from the group consisting of: high pressure mercury lamp, KrF excimer laser, ArF excimer laser, electron beam, x-ray, and any combinations thereof.

50. The lithographic imaging rework process of claim 22, wherein said radiation has a wavelength of about 248 nm or less.

51. The lithographic imaging rework process of claim 50, wherein said radiation has a wavelength of 193 nm or 248 nm.

52. The lithographic imaging rework process of claim 22, further comprising, after step (e), the step of baking said exposed new imaging layer.

53. The lithographic imaging rework process of claim 52, wherein said baking step is carried out for between about 5 seconds to about 300 seconds.

54. The lithographic imaging rework process of claim 53, wherein said baking step is done at a temperature between about 50° C. to about 150° C.

55. The lithographic imaging rework process of claim 22, wherein said developing step (f) comprises the use of an aqueous alkaline solution developer.

56. The lithographic imaging rework process of claim 55, wherein said aqueous alkaline solution developer comprises aqueous solutions selected from the group consisting of: alkali metal silicates, phosphates, hydroxides, carbonates, tetra alkylammonium hydroxides, tetramethylammonium hydroxide (TMAH), and any combinations thereof.

57. A rework process for removing an imaging layer from a substratestack, said stack comprising a substrate, an underlayer adjacent to said substrate, and an imaging layer comprising silicon adjacent to said underlayer, said process comprising the steps of:
 (a) contacting said substrate stack with an imaging layer removal solvent;
 (b) removing said imaging layer with said imaging layer removal solvent thereby forming an organic substrate/underlayer stack, wherein said imaging layer removal solvent is selected from the group consisting of: glycol ethers, ketones, esters, lactates, dimethylsulfoxide (DMSO), dimethylformamide (DMF), tetrahydrofuran (THF), methyl tetrahydrofuran, dioxane, tetrahydropyran, ethyl tetrahydropyran-4-acetate, methyl tetrahydropyran-4-methanol, tetrahydropyran-4-one, n-butyl acetate, n-amyl acetate, and any combinations thereof;
 (c) rinsing said imaging layer removal solvent from said organic substrate/underlayer stack with a rinse solution after said imaging layer is removed; and (d) baking said organic substrate/underlayer stack to remove said rinse solution.

58. The rework process of claim 57, wherein said substrate is selected from the group consisting of: silicon, nitrides, oxides, oxynitrides, inorganic derivatives of silicon, coatings of nitrides, metals, low k dielectric coatings, low-k organic material, copper, aluminum, tungsten, carbon-doped oxide, carbon-doped silicon, and any combinations thereof.

59. The rework process of claim 57, wherein said underlayer is one or more organic films.

60. The rework process of claim 57, wherein said imaging layer is a chemically amplified photoresist.

61. The rework process of claim 57, wherein said imaging layer on said substrate stack has not been exposed to radiation.

62. The rework process of claim 57, wherein said imaging layer on said substrate stack has been exposed to a radiation source and a developer.

63. The rework process of claim 57, wherein said imaging layer removal solvent is selected from the group consisting of: ketones, esters, 2-heptanone, methyl propyl ketone, PGME, PGMEA, ethyl lactate, cyclohexanone, n-butyl acetate, tetrahydrofuran, methyl tetrahydrofuran, glycol mono ethers, and any combinations thereof.

64. The rework process of claim 57, wherein said imaging layer removal solvent is selected from the group consisting of: 2-heptanone, cyclohexanone, n-butyl acetate, PGME, PGMEA, ketone mixtures where the ketone comprises greater than 50% of the imaging layer removal solvent, glycol mono ether solvent where the glycol mono ether solvent comprises greater than 50% of the imaging layer removal solvent, ternary or higher mixtures of ketones, glycol mono ethers, and glycol monoether esters, and any combinations thereof.

65. The rework process of claim 57, wherein said imaging layer removal solvent is selected from the group consisting of: 2-heptanone, cyclohexanone, n-butyl acetate, PGME, PGMEA, a solvent mixture comprising about 70% to about 90% ketone and about 10% to about 30% lactate, a solvent mixture comprising about 70% to about 95% glycol monoether and 5% to about 30% lactate, a solvent mixture comprising about 50% to about 70% glycol monoether, about 1% to about 20% ketone, and about 5% to about 35% glycol monoether ester, and any combinations thereof.

66. The rework process of claim 57, wherein said rinsing step (c) comprises rinsing said substrate/underlayer stack with water, additional imaging layer removal solvent, or any combinations thereof.

67. The rework process of claim 57, wherein said baking step (d) comprises a baking means selected from the group consisting of: oven baking, hot plate baking, infrared baking, and any combinations thereof.

68. The rework process of claim 57, wherein said baking step (d) is carried out at a temperature between about 100° C. to about 205° C.

* * * * *